United States Patent [19]
Hong et al.

[11] 3,958,110
[45] May 18, 1976

[54] LOGIC ARRAY WITH TESTING CIRCUITRY

[75] Inventors: Se J. Hong; Daniel L. Ostapko, both of Poughkeepsie, N.Y.

[73] Assignee: IBM Corporation, Armonk, N.Y.

[22] Filed: Dec. 18, 1974

[21] Appl. No.: 534,022

[52] U.S. Cl. ............................................ 235/153 AC
[51] Int. Cl.² ........................................... G06F 11/00
[58] Field of Search ................. 235/153 AC, 153 A; 340/146.1 AG, 146.1 AB, 172.5, 174 ED, 174 TC; 324/73 R, 73 AT

[56] References Cited
UNITED STATES PATENTS

| | | | |
|---|---|---|---|
| 2,958,072 | 10/1960 | Batley | 235/153 A |
| 3,428,945 | 2/1969 | Toy | 340/146.1 AB |
| 3,466,602 | 9/1969 | Moser et al. | 340/146.1 AG |
| 3,735,105 | 5/1973 | Maley | 235/153 AC |
| 3,781,793 | 12/1973 | Henle et al. | 340/146.1 AG |
| 3,784,978 | 1/1974 | Zola | 235/153 A |
| 3,789,205 | 1/1974 | James | 235/153 AC |
| 3,790,885 | 2/1974 | James | 235/153 AC |
| 3,813,032 | 5/1974 | King | 235/153 AC |
| 3,813,647 | 5/1974 | Loo | 235/153 AC |

*Primary Examiner*—Charles E. Atkinson
*Attorney, Agent, or Firm*—James E. Murray

[57] ABSTRACT

This specification describes arrays for performing logic functions which include circuitry for testing the arrays to see if the arrays will perform the logic functions that they were designed to perform. This circuitry eliminates the need for storing information as to logic functions performed by any particular array and allows a uniform testing sequence to be used in testing all the arrays.

7 Claims, 4 Drawing Figures

FIG. 2
| A·B | A·B̄ | Ā·B | Ā·B̄ | PRODUCT TERM FUNCTION FRAMED |
|---|---|---|---|---|
| 0 | 0 | 0 | 0 | DON'T CARE |
| 0 | 0 | 0 | 1 | A+B |
| 0 | 0 | 1 | 0 | A+B̄ |
| 0 | 0 | 1 | 1 | A |
| 0 | 1 | 0 | 0 | Ā+B |
| 0 | 1 | 0 | 1 | B |
| 0 | 1 | 1 | 0 | A ≡ B |
| 0 | 1 | 1 | 1 | A · B |
| 1 | 0 | 0 | 0 | Ā+B̄ |
| 1 | 0 | 0 | 1 | A⊕B |
| 1 | 0 | 1 | 0 | B̄ |
| 1 | 0 | 1 | 1 | A · B̄ |
| 1 | 1 | 0 | 0 | Ā |
| 1 | 1 | 0 | 1 | Ā · B |
| 1 | 1 | 1 | 0 | Ā · B̄ |
| 1 | 1 | 1 | 1 | FALSE |
NEVER USED
FIG. 3
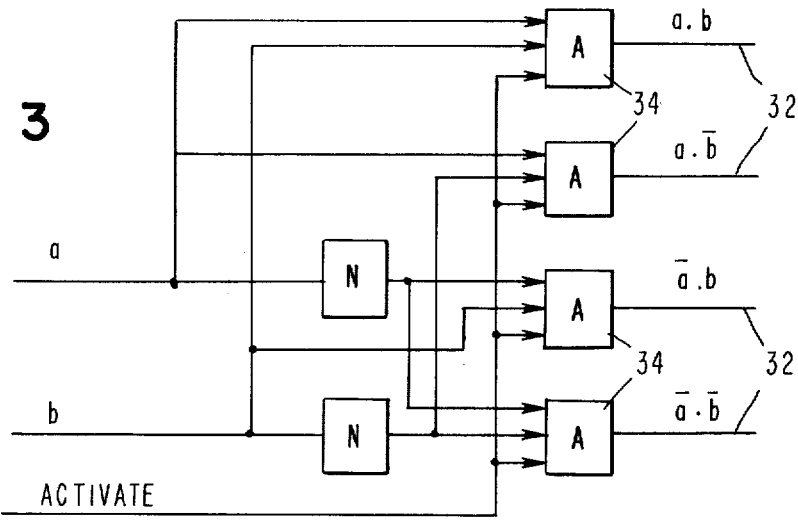
FIG. 4
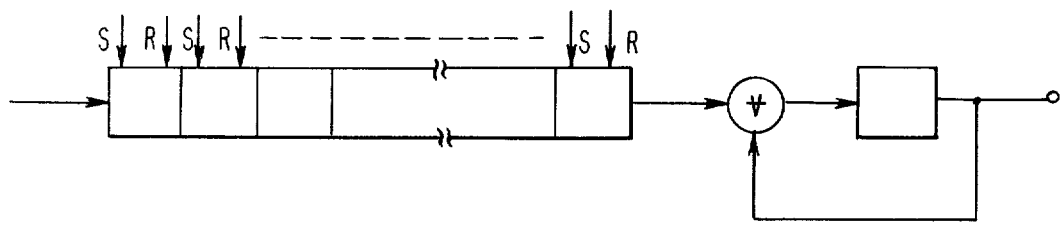

3,958,110

LOGIC ARRAY WITH TESTING CIRCUITRY

BACKGROUND OF THE INVENTION

The present invention relates to arrays for performing logic functions and more particularly it is related to testing such arrays.

The performing of logic in a matrix or an array of identical circuit elements each located at a unique intersection of an input and output line in a grid of input and output lines is well known. One very desirable arrangement for addressing such an array uses a plurality of decoders to generate interrogation signals for the input lines of the array from input variables supplied to the decoders. Difficulty has been experienced in testing arrays addressed in this manner because, for each combination of input variables, each of the decoders interrogates one of the input lines of the array. Therefore the signals on the output lines of the array are a result of simultaneous interrogation of a number of input lines and it is difficult to determine whether the output signals from the interrogation of any one line are proper. Of course the arrays could be checked by storing the desired output signal for each possible combination of input variables. However this method would require storing a very large number of output signal combinations for each different array configuration manufactured.

THE INVENTION

In accordance with the present invention different array configurations can be tested with a standard testing technique without the storage of information of the array's configuration in the testing equipment. This is accomplished by additions to the decoders and the array. First of all, in addition to the input variables, each of the decoders in the array is adapted to receive a gating signal that controls the coupling of the interrogation signals to the input lines of the array. During testing, the gating signal is used to couple the interrogation signals of one of these decoders at a time to the input lines of the array. This allows the interrogation of one input line at a time and the detection of the output signals produced by that interrogation on the output lines of the array. To determine whether the output signals are proper, the array contains one or more additional output lines which contain parity or check bits on the circuit elements arranged along each of the input lines. When an input line is interrogated the output signals including those produced by the parity or check bits are exclusively OR'd to determine if the interrogated input line contains the proper number of circuit elements.

In the preferred embodiment of the invention, the invention is used to test a programmable logic array in which the decoders interrogate an array of AND circuits which in turn feeds the output signals of this interrogation to input lines of an array of OR circuits to interrogate the array of OR circuits. The AND array is tested in the manner described above. To test the OR array an additional input line is placed on the AND array which when selected places a binary zero output signal on each of the input lines of the AND array thereby masking the OR array from the output signals of the AND array and permitting other signals to be placed into the OR array to test the OR array one line at a time. Again a one or more additional output lines containing parity or check bit information are added to the OR array so that the data read out of the OR array can be exclusively OR'd to determine if lines are in error.

Therefore it is an object of the present invention to permit testing of array chips.

It is also an object of the present invention to simplify testing of array chips.

It is a further object of the present invention to provide an array chip that contains circuits that permit the use of a common test sequence irrespective of the personality of the chip.

DRAWINGS

These and other features and advantages of the invention will be apparent from the following more particular description of the preferred embodiment of the invention of which:

FIG. 2 is a chart of the logic functions performed on any two inputs in the AND array of the programmed logic array chip of FIG. 1;

FIG. 3 is a more detailed schematic representation of one of the input decoders for the program logic array chip of FIG. 1 and;

FIG. 4 is a schematic representation of an alternative form of the EX-OR circuitry used in the present logic array chip of FIG. 1.

DETAILED DESCRIPTION

Figure 1:
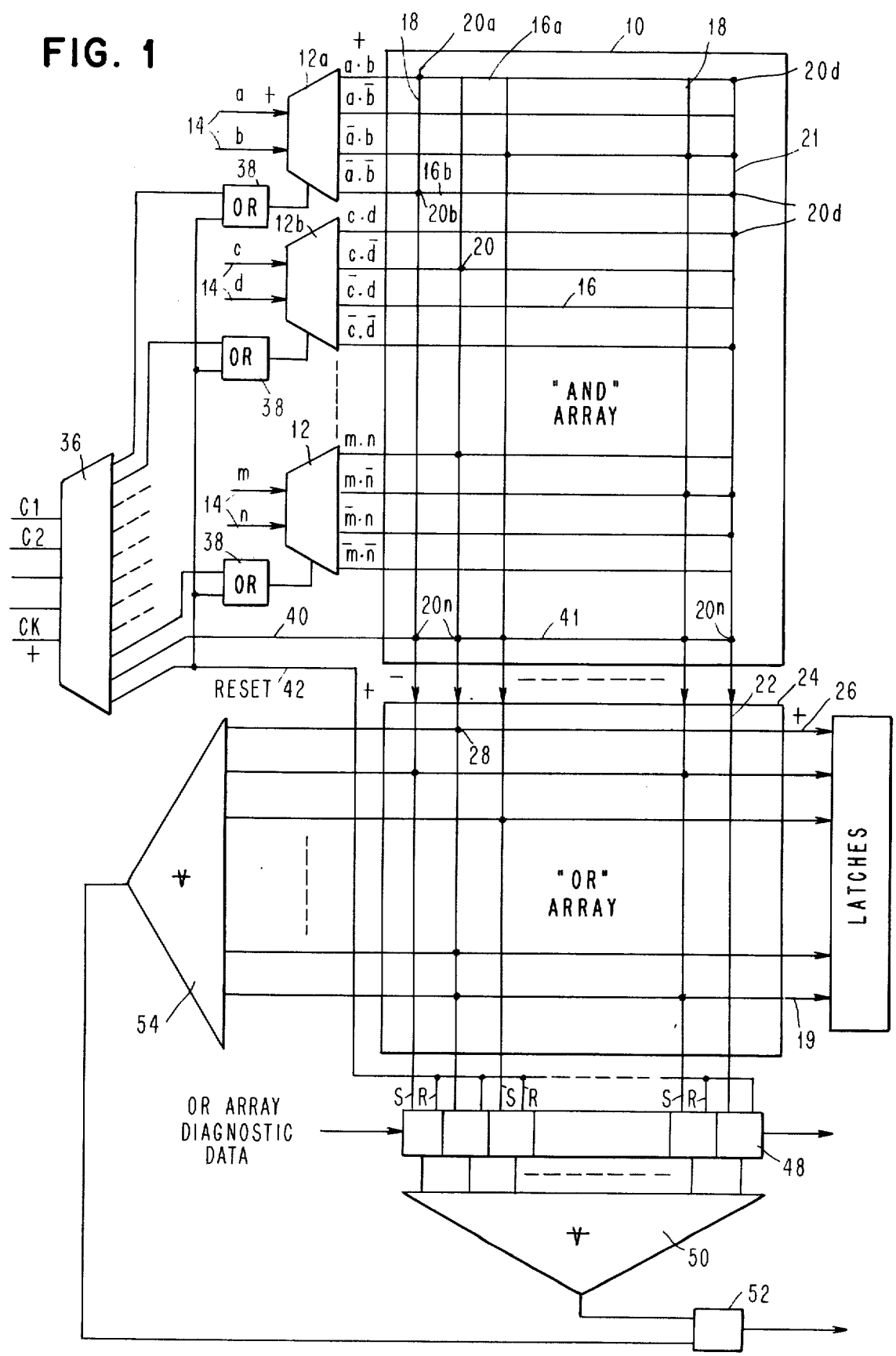
FIG. 1 is a layout for a programmed logic array chip incorporating the present invention.

Referring now to FIG. 1, an AND array 10 is connected to a plurality of two-bit input decoders 12 located along the left hand edge of the array. The decoders 12 receive input variables on input lines 14 and provide an interrogation signal to different input line 16 in the array 10 for each of the four possible combinations of the two input variables. Arranged orthogonally with respect to input line 16 are a plurality of output lines 18 that form a grid with the input lines, and located at the intersections of the input and output lines 16 and 18 are logic performing devices 20. These logic performing devices 20 perform an AND operation, on interrogation signals placed on the input lines 16 and provide the resultant on the output lines 18. The output lines 18 of the AND array 10 are connected to the input lines 22 of an OR array 24. The input lines 22 of the OR array intersect output lines of the OR array. Located at the intersection of the input lines 22 and the output lines 26 are logic producing elements 28 that perform an OR function with respect to signals received from the AND arrays on the input lines 22 and provide the resultant on the output lines 26. The logic performing elements 20 and 28 are the same. They are a single device such as an FET with its gate connected to an input line, its sink converted to reference potential and its source connected to an output line. Each output line is connected through a resistive device to a source of positive potential. Therefore the logic elements 20 and 28 are inverters so that a positive signal on an input line 16 of array 10 becomes a negative signal on an output line of array 10 and a negative signal on an input line 22 of array 24 becomes a positive signal on an input line 26 of array 24.

As can be seen logical functions can be performed on the input variables, in the two-bit decoders 12, the AND array 10 and the OR array 24. The different logical functions that can be performed in the decoders 12, and the AND array 10 on two inputs $a$ and $b$ to the decoder 12a are shown in FIG. 2. Each column in the chart represents one of the four input lines 16 connected to the decoder 12. The heading on each column is the function performed in the decoder 12 on the inputs $a$ and $b$ that places an interrogation signal on the input line represented by the column. The legends on each row indicate the logical function that will be placed on an output line when the input lines of the array marked with a binary 1 in their column are ANDed together by coupling those input lines to the output line with logic performing elements. For instance, the Exclusive OR function of $a$ and $b$ is placed on output line 18 when input lines 16a and 16b are connected to it by the logic elements 20a and 20b. Performing logic operations using arrays and detectors in this manner is well known and can be found in Weinberger U.S. Pat. No. 3,761,902, dated Sept. 25, 1973.

As pointed out above, problems exist in testing these arrays because for every combination of input variables each decoder places an interrogation signal on one of the input lines of the array. Therefore, at any time $n/2$ of the input lines of the AND array will be driven. This makes it very difficult to determine if any one line has the proper personality or in other words to determine if the AND circuits 20 are properly positioned along any input line to provide the desired logic functions on the output lines of the AND array. Of course a test could be performed in which the output signal produced by each combination of input variables is compared with the proper output pattern. However, this would require the storing of a number of output patterns for each array. Since the personality of the arrays vary with the logic function to be performed by the array it would mean the tester would be required to have a significant memory if it is to test any reasonable number of different array personalities.

In accordance with the present invention this is avoided by providing an additional output line 21 for the array and means for deactivating the output of all but one of the decoders at any one time. Now with only one decoder operating at any given time the output signal would reflect the personality of only one of the input lines. Therefore, by placing a parity bit along input lines at their intersection with the additional output line 21 to perform an even parity function, the array can be checked input line by input line for errors by Exclusive ORing the number of output signals on the output lines 18 with the parity signal on line 21. Because of the inversion of signals by the elements 20, the placing of a circuit element 20d along any given input line depends on the number of output lines that are not connected to that input line. The modification in the decoders 12 of the array needed to incorporate the activate function is shown in FIG. 3. Instead of having two-way AND gates to select one of the four output lines of the decoder, three-way AND gates 34 are used. Each of these AND gates receives either the true or inverted signal of both the inputs $a$ and $b$ plus a signal to its ACTIVATE input so that there would be no output on any of the input lines of the array unless the signal to the ACTIVATE input is up.

The ACTIVATE input to each of the decoders 12 is connected through an OR gate 38 to a separate output line of control decoder 36. In addition to an output line for each of the decoders 12, the control decoder 36 has two additional output lines. The first additional output line 40 goes to a masking line 41 in the array 10 and the second additional output line 42 is connected through the OR gates 38 to the ACTIVATE input of all the decoders 12 and to the reset inputs of all the stages in a shift register 48. To repeat, there are $n/2+2$ outputs of the decoders 36, one going to each of the decoders 12 plus the mask and reset outputs 40 and 42. The decoder has $k$ inputs where $k = \lceil \log_2 (n/2 + 2) \rceil$. By changing the combinations of input signals C1 to CK of the binary decoder 36, a binary 1 is placed on one of the output lines of decoder 36 and the remaining lines receive binary 0. If the binary 1 is fed to one of the decoders, the outputs of all but the selected decoders are masked so that only one of the input lines 16 is energized. Therefore, testing of the lines can be performed simply by selecting one decoder 12a through the proper combination of inputs to decoder 36, changing the input variables to the array to test the personality of the four input lines connected to the selected decoder 12a then changing the inputs to decoder 36 to activate another decoder 12b again changing the input variables to the array to test each of the outputs associated with that decoder and so on so that each of the input lines of the array receives an interrogation signal and no two input lines of the array are energized at the same time during the testing sequence. As each line is tested the resultant is placed in shift register 48 and an Exclusive OR operation is performed on the contents of the shift register by an Exclusive OR tree 50. If the output of the Exclusive OR tree is 0 as determined by detector 52, we assumed that the input line has its designed personality. If the detector detects a 1 in the output of the Exclusive OR tree 50 it means that the line does not agree with parity and therefore, the line is not as it was designed to be so. Of course, if more accurate tests are to be performed, additional lines 18 could be added for more check bits to permit multiple error detection.

Once each of the input lines 16 of the AND array has been interrogated and its output has been checked in this manner, the OR array 24 may be tested. This is accomplished by supplying the proper combination of inputs to decoder 36 to select the masking line 40. The masking line 40 contains a logical circuit element 20n at the intersection of each of the output lines with the masking line 40. Thus it provides an output signal on each of the output lines of the AND array. This would be a down signal so that the input to the OR array would be effectively masked from the outputs of the AND array. The OR array can then be tested by clearing the shift register 48 of all data and placing a 1 in the first position of the shift register. This 1 is shifted from position to position of the shift register to interrogate each of input lines of the OR array individually. These time descriminated output signals are then fed into Exclusive OR tree 54 for detection of errors in the same manner as the AND array is checked. Like the AND array, the OR array has a parity bit line 19. This parity bit line runs even parity on the number of circuits connected to each input line of the OR array. Therefore a binary 1 from the Exclusive OR tree would indicate the check line was in error while a binary 0 output would indicate that the number of circuits on the line matched parity.

The selection by the decoder 36 of the final line places a binary 1 on the reset input of each place of the shift register 48 and a binary 1 on the activate line of each of the decoders 12 and a binary 0 for the master mask line. This allows the programmed logic array chip to perform the logic functions they were designed to perform since all the decoders would be operable and the mask line and shift registers would be transparent to the logic arrays.

During test and diagnosis a two step operation is used to check all single faults in the array.

a. Checking and AND array.
0. Select the reset output line 42 with the Control decoder 36.
1. Select one input decoder 12 with the Control decoder 36.
2. Select an input line 16 with signals supplied to the inputs of the selected decoder.
3. If error is present, the contents of the shift register 48 can be read out for diagnosis.
4. Go to step 0 until all the input lines 16 are tested.

b. Checking the OR array.
0. Select the reset line 42 with the Control decoder.
1. Select the master mask line 40 with the Control decoder.
2. Shift a single 1 into the shift register 48.
3. At each shift of the shift register the error signal is observed using the Exclusive OR tree 54.

The amount of structure used for testing, can be reduced by using a shift register as shown in FIG. 4 in place of the shift register 48 and the Exclusive OR tree 50. The Exclusive OR tree 54 is likewise replaceable by the shift register of FIG. 4. Here the use of an additional stage on the shift register in combination with a single Exclusive OR circuit permits the Exclusive ORing of the contents of the shift registers by shifting the data in the shift registers one position at a time into the additional stage. Of course this is much slower than the use of the Exclusive OR tree; however, the saving in logic is significant.

Two embodiments of the present invention have been described. Both permit the use of standard testing sequence to test a variety of different array configurations without the storing of data in the tester as to the different array configurations. This permits the use of what is called broadcasting or in other words the testing of many arrays in parallel using the same testing sequence and equipment. Therefore, it will be understood by those skilled in the art that the above and other changes in form and details may be made therein without departing from the spirit and scope of the invention.

What is claimed is:

1. In combination with a logic performing array comprising a grid of intersecting input and output lines with operative logic means located in at least some of the intersections and having a plurality of input decoders each interrogating a selected one of a plurality of input lines so that logic functions are performed on interrogating signals by the logic means and results presented on the output lines, apparatus for testing the array comprising;
   a control decoder in which each different combination of input signals to the decoder causes the decoder to select a different one of the output lines of the control decoder; and,
   AND circuit means in each input decoder for ANDing one output of the control decoder with a true or inverted signal for each of the inputs of the decoder to generate an interrogation signal for each of the input lines of the array that is dependent on the presence of a select signal from the control decoder,
   check line means intersecting the input lines for maintaining check information on the number of operative logic means located along each of the input lines of the array whereby the number of bits of each input line can be read out along with the check information to be used in a determination to see if the line is properly configured.

2. The combination of claim 1 wherein said means for interrogating includes gating means for selectively activating and deactivating the decoders.

3. The combination of claim 1 wherein an additional output of said control decoder is fed to all the AND circuit means in all decoders so that when that additional output is selected all the decoders are activated at the same time.

4. In a programmable logic performing array including a product term generator that is interrogated on its input lines by interrogation signals generated by a plurality of input decoders and a sum of product term generator with input lines each coupled to a different output line of the product term generator in which both the product term generator and the sum of product term generator are arrays of intersecting input and output lines with operative logic performing means located at some of the intersections of input and output lines to perform logic on interrogating signals supplied to the input lines of the product term generator, apparatus for testing the logic performing array comprising;
   gating means for selectively activating each of the input decoders one at a time so that only one input line of the product term generating means is interrogated at one time;
   first check line means intersecting said input lines of said product term generator for maintaining check information on the number of oprative logic means located along each of the input lines of the product term generator;
   isolation line means in said product term generator for producing a signal isolating the sum of product term generator from the output signals of said product term generator;
   interrogation means for interrogation of each of said input lines of the sum of the product term generator at a different time; and,
   a second check line means intersecting each of the lines in the sum of product term generator for storing check information on the number of operative logic means located along each of the input lines of the sum of the product term generator whereby each of the input lines of the product term generator and the sum of product term generator can be individually interrogated to read out the number of bits on that input line along with the check information to be used in a determination to see if the line is properly configured.

5. The programmable logic array of claim 4 in which said interrogation means is a shift register with a stage coupled to each of the input lines of said sum of the product term generator.

6. The programmable logic array of claim 4 including Exclusive OR means coupled to the input and output lines of the sum of the product term generator for summing the output produced by the interrogation of the product term generator and the sum of the product term generator respectively.

7. The programmable logic array of claim 5 including means for simultaneously activating all of the input decoders and clearing the shift registers so that logic functions can be performed in the programmable logic array.

* * * * *